US008795502B2

(12) United States Patent  
Cotte et al.

(10) Patent No.: US 8,795,502 B2  
(45) Date of Patent: Aug. 5, 2014

(54) ELECTRODEPOSITION UNDER ILLUMINATION WITHOUT ELECTRICAL CONTACTS

(75) Inventors: John M. Cotte, New Fairfield, CT (US); Harold J. Hovel, Katonah, NY (US); Devendra K. Sadana, Pleasantville, NY (US); Xiaoyan Shao, Yorktown Heights, NY (US); Steven Erik Steen, Peekskill, NH (US)

(73) Assignee: International Business Machines Corporation, Armonk, NY (US)

( * ) Notice: Subject to any disclaimer, the term of this patent is extended or adjusted under 35 U.S.C. 154(b) by 665 days.

(21) Appl. No.: 12/778,689

(22) Filed: May 12, 2010

(65) Prior Publication Data

US 2011/0278172 A1   Nov. 17, 2011

(51) Int. Cl.  
C25D 5/00   (2006.01)  
C25D 5/02   (2006.01)  
C25D 7/12   (2006.01)  
C25D 17/00  (2006.01)

(52) U.S. Cl.  
USPC ............. 205/91; 204/242; 205/123; 205/126; 205/157

(58) Field of Classification Search  
USPC ................................... 205/91, 123, 126, 157  
See application file for complete search history.

(56) References Cited

U.S. PATENT DOCUMENTS

| 4,006,045 | A  | * | 2/1977  | Aboaf et al. ............. 438/542 |
| 4,144,139 | A  |   | 3/1979  | Durkee |
| 4,242,423 | A  | * | 12/1980 | Hada ....................... 429/111 |
| 4,251,327 | A  |   | 2/1981  | Grenon |
| 4,507,181 | A  |   | 3/1985  | Nath et al. |
| 7,169,283 | B2 |   | 1/2007  | Yagi et al. |
| 2002/0036146 | A1 |   | 3/2002  | Akutsu et al. |
| 2004/0118690 | A1 |   | 6/2004  | Yoshitani |
| 2005/0208319 | A1 | * | 9/2005  | Finley et al. ............. 428/545 |
| 2006/0166474 | A1 | * | 7/2006  | Vereecken et al. ....... 438/584 |
| 2008/0277285 | A1 | * | 11/2008 | Vereecken ................ 205/123 |
| 2011/0011745 | A1 | * | 1/2011  | Ji et al. ...................... 205/91 |
| 2011/0052835 | A1 | * | 3/2011  | Minsek ...................... 427/581 |

* cited by examiner

Primary Examiner — Nicholas A Smith  
Assistant Examiner — Brian W Cohen  
(74) Attorney, Agent, or Firm — Novak Druce Connolly Bove + Quigg LLP; Louis J. Percello, Esq.

(57) ABSTRACT

A method of forming patterned metallization by electrodeposition under illumination without external voltage supply on a photovoltaic structure or on n-type region of a transistor/junction.

19 Claims, 2 Drawing Sheets

ELECTRODEPOSITION UNDER ILLUMINATION WITHOUT ELECTRICAL CONTACTS

TECHNICAL FIELD

The disclosure relates to an alternative method of light-induced plating in two separate tanks, which may be used to plate metal on a photovoltaic structure or on the n-region of a semiconductor junction or transistor without external voltage supply.

BACKGROUND OF THE DISCLOSURE

Screen printing is widely used in the photovoltaic industry to form metal contacts of solar cells mainly due to its low cost and high throughput. Despite the disadvantages in high contact resistance, high bulk resistivity, low line aspect ratio, and limitation on cell design, silver (Ag) and AlAg is the main screen printing metal used today due to its low resistivity and availability. Although copper (Cu) has low resistivity and is much more abundant and lower cost, it is not chosen because its difficulty in screen printing.

Conventional photovoltaic cells are formed from monocrystalline, polycrystalline, or multicrystalline silicon (Si). Monocrystalline, multicrystalline, and polycrystalline materials are entirely or almost entirely crystalline, with no or almost no amorphous matrix. Photovoltaic cells fabricated from substantially crystalline material are conventionally formed of wafers sliced from a Si ingot, or Si ribbons pulled from Si melt.

Light-induced (illumination) plating methods onto solar cells were introduced in the 1970s.

U.S. Pat. No. 4,144,139 describes the light-induced plating method for solar cells under illumination. Plating electrical contacts onto one or more surfaces of a solar cell having an electrical junction therein is accomplished by immersing the cell in an electrolyte and exposing it to light so that platable ions in the electrolyte will be attracted to an oppositely charged surface of the cell. This method uses no external power supply and need no electrical contact to deposit silver on the front side n-emitter while dissolving silver from the back side surface. The deposition is carried out within one tank setup.

U.S. Pat. No. 4,251,327 describes a method for electroplating a metallic layer onto the surface of a photovoltaic device absent any external electrical contacts to the surface. The photovoltaic device is placed in an electrolytic plating bath where it is illuminated with electromagnetic radiation to which the device is photovoltaically responsive. Plating from the electrolytic bath results from current flow generated in the device itself.

This patent describes an improved embodiment over U.S. Pat. No. 4,144,139 by using immersion palladium deposition followed by 300° C. silicidation process, followed by electroless palladium deposition and further silicidation, and then followed by silver plating. It also describes a second embodiment using external current supply to the backside of the wafer to have both sides plated. The deposition is also carried out within one tank.

Dube, C. E. and Gonsiorawski, R. C., in their publication "Improved contact metallization for high efficiency EFG polycrystalline silicon solar cells" at the Twenty First IEEE Photovoltaic Specialists Conference, describe plating copper (Cu) with dissolving Cu on the backside of the solar cell by using laser patterning to create dense contact vias on the front.

The advantages of the light-induced plating method compared with electroless deposition and the above-mentioned conventional electroplating techniques are listed in the following Table.

TABLE

| Electrodeposition | Electroless deposition | Electrodeposition under Illumination |
|---|---|---|
| Requires electrical contact to each pattern for deposition | No electrical contact needed | No electrical contact needed |
| External power supply for carrying out deposition | No need for external power supply, but need thermal heating of the solution | No need for external power supply, nor thermal heating. Potentially can use sunlight |
| Low cost & high throughput | High cost & low throughput due to the need for complex bath monitoring | Low cost & high throughput |
| Pure materials deposited | More resistive materials due to inclusion of impurities such as Phosphorus & boron | Pure materials deposited |

A disadvantage of the basic methods described in U.S. Pat. No. 4,144,139 and U.S. Pat. No. 4,251,327 is that the deposition of metal and dissolution of metal occurs in the same solution. This method intrinsically makes process monitoring very difficult, since it does not provide the control on the current/charge during the process, which makes it difficult to monitor the amount of deposit. Furthermore, the chemical components used in the plating solution must be compatible with both the plating process and the dissolution process on the backside of the substrate.

Another disadvantage of the single tank approach is that it is difficult to deposit metals that will not dissolve in their own plating solution. When the metal being deposited does not dissolve in its own plating solution, oxygen evolution will occur instead of metal dissolution on the back. The potential driving force needed for the deposition of a metal coupled with oxygen evolution is much larger than the potential driving force needed for the deposition of a metal coupled with the dissolution of a metal. Nickel and palladium are examples of these metals.

In order to deposit nickel or palladium by a single-tank setup, an external voltage must be supplied to carry out the deposition.

Thus, there is a need for an efficient low cost and high through-put process, one in which two separate tanks are used during the process, and in which the current/charge passed between the two separate tanks can be monitored and the structure/surface is protected from corrosion, and there is no need for external voltage supply for the electrodeposition other than light illumination.

SUMMARY OF THE DISCLOSURE

The present disclosure relates to a method to form copper (Cu) grid by electrodeposition under illumination, which is also a low cost and high throughput process. An aspect of the present disclosure is that the electrodeposited Cu offers very low resistivity (about 1.8 micro-ohm-cm), high line aspect ratio (>1.0) with a round top, and minimum impact on the solar cell performance due to the elimination of high temperature firing process. Due to the easiness in integration and lower processing, electrodeposited metal grid using illumination provides an advantage over existing screen printing metallization methods.

DETAILED DESCRIPTION OF THE DISCLOSURE

A more complete appreciation of the disclosure and many of the attendant advantages will be readily obtained, as the same becomes better understood by reference to the following detailed description when considered in connection with the accompanying drawings.

Figure 1A:
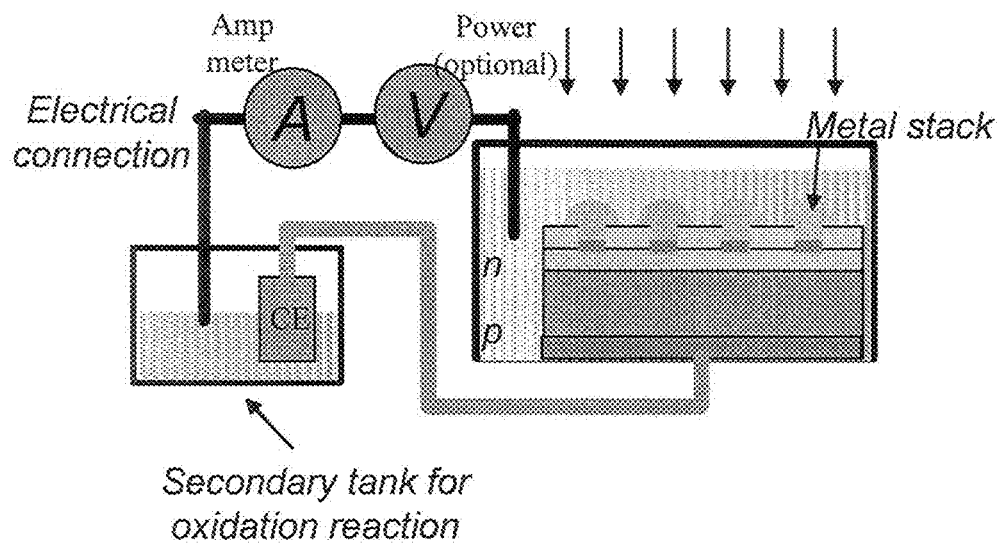
FIG. 1 illustrates two different setup methods for the two tank system of the present disclosure.
Figure 1B:
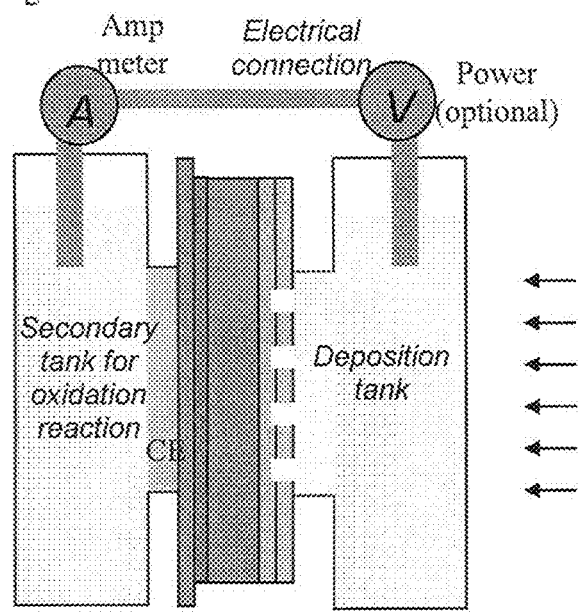

FIG. 1 shows the illustrations of two setups used for the light induced plating, which is a two tank system. In the plating tank, the solar cell device is illuminated from the front (n-emitter) and the backside (p-Si) makes electrical contact to an external conductive wire, which is electrically connected to the solution in the secondary tank.

In a preferred embodiment, an amp meter is connected for monitoring current/charge passed during deposition. Optional power supply can be connected in the circuit to increase or decrease the voltage output used for plating.

An additional electrical path between these two tanks may be used to complete the circuit and maintain charge neutrality. An amp meter is placed on this electrical route to measure passed current and charge during deposition, which is directly related to the amount of materials plated on the n-emitter. The optional power supply is connected in this electrical route to modulate the effective potential generated for plating on the surface of the n-emitter.

In a preferred embodiment, the solar cell is composed of a n-Si emitter layer on top of a p-Si base. The p-Si is may be coated with a conductive layer, such as aluminum (Al), silver (Ag), Al/Ag conductive materials. The thickness of the conductive layer may be, for example, about 5 to 50 microns.

The n-emitter surface may also be textured to minimize reflection. An optional passivation layer (thermal $SiO_2$) and antireflection layer (nitride, nitride/oxide double layer, $TiO_2$, and $MgF_2$) with grid pattern may also be deposited on the n-emitter surface to improve device performance. The grid pattern opens directly down to the n-Si surface.

In a preferred embodiment, the antireflective layer is configured to restrain reflection of incident light on the light-receiving surface of the semiconductor substrate, and is formed on a passivation layer. The thickness of the passivation layer formed preferably of about 0.5 nm to about 5 nm. The antireflective layer is preferably formed as a silicon nitride film, an oxide material film, such as a $TiO_2$, $SiO_2$, MgO, ITO, $SnO_2$ or ZnO.

In another preferred embodiment, the value of the thickness of the antireflective film is varied in accordance with the material used for the antireflective film. The thickness of the antireflective film is set to a value permitting conditions for non-reflection of incident light to be realized. In a case where the antireflective layer is formed as a $SiN_x$ film (n is about 2), the thickness of the antireflective layer is preferably about 75 nm when the wavelength of light to be made non-reflective is about 600 nm based on the sunlight spectral characteristics. When a surface passivation effect is in the film that constitutes the antireflective layer, the formation of the passivation layer may be omitted.

By illuminating the solar device in a metal plating solution, such as copper (Cu) plating baths, nickel (Ni) plating solutions, and cobalt (Co) plating baths, a photocurrent and voltage are generated across the device, with electrons separated to reach grid pattern on the n-emitter surface, and holes separated to reach the p-Si metal contact layer. Metals will begin depositing on the silicon surface of the grid pattern. Thus, the deposition rate can be tuned by varying the light intensity, the external power supply, and the built in device efficiency.

Figure 2:
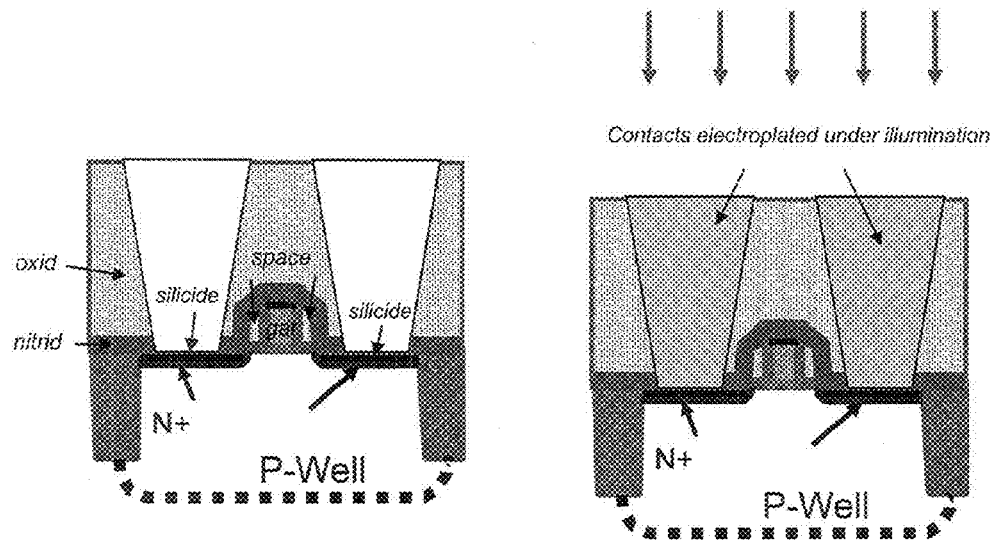
FIG. 2 illustrates a selective metallization of n-Si in a silicon transistor/junction by light illuminated plating.

FIG. 2 provides a selective metallization of n-Si in a silicon transistor/junction by light illuminated (induced) plating. In particular, another area of application of the light-induced plating is to selectively deposit metal on n-Si region of a transistor or junction, as shown in FIG. 2.

Figure 3:
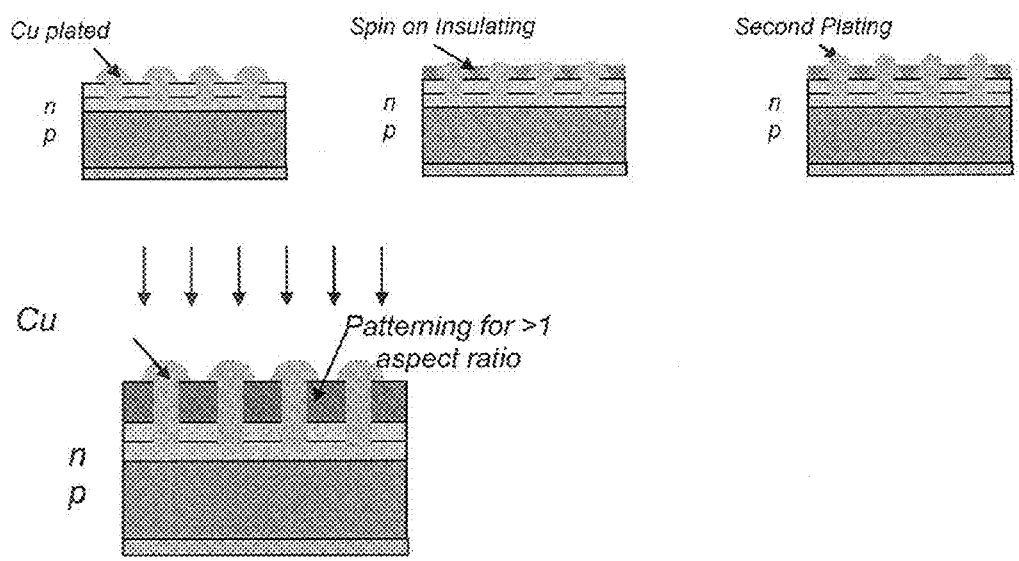
FIG. 3 illustrates the use of spin on insulating and transparent dielectric to build a higher aspect ratio of a grid structure.

FIG. 3 illustrates the use of spin on insulating and transparent dielectric to build a higher aspect ratio grid structure. In particular, another aspect of the method disclosed may be to generate high aspect ratio grid structures, as shown in FIG. 3.

EXAMPLES

The following non-limiting examples are presented to further illustrate the light-induced electro plating process of the disclosure.

Example 1

A copper (Cu) grid was plated using a Cu plating solution. A piece of Cu was used as the counter electrode (CE). Cu strips were used as electrical connection wires. The same or a simplified Cu solution were used in the secondary tank without the additives and lower chemical concentrations to make a high quality copper deposit. The secondary tank solution included chemical ions with reversible redox reactions, such as $V^{2+}/V^{3+}$, and $Fe^{2+}/Fe^{3+}$ However, additional chemical ions with reversible redox reactions may be used.

Example 2

A cobalt (Co) grid was plated using a cobalt plating solution. A piece of Co was used as the counter electrode (CE). Co strips were used as electrical connection wires. The same Co solution was used in the secondary tank, or a simplified cobalt solution with lower chemical concentrations, and omission of some of the additives can be used in the secondary tank. The secondary tank solution included chemical ions with reversible redox reactions, such as $V^{2+}/V^{3+}$, and $Fe^{2+}/Fe^{3+}$. However, additional chemical ions with reversible redox reactions may be used.

Example 3

A nickel (Ni) grid was plated using a Ni plating solution. A piece of Ni, Pt, or Ti was used as the counter electrode (CE). Ni strips were used as electrical connection wires. The same Ni solution was used in the secondary tank. The secondary tank solution included chemical ions with reversible redox reactions, such as $V^{2+}/V^{3+}$, and $Fe^{2+}/Fe^{3+}$. However, additional chemical ions with reversible redox reactions may be used.

The following list shows a summary of metals/ions that may be used in the secondary tank for deposition of different metals on the n-Si of the solar cell in the deposition tank.

Electrodeposit Cu, Ag, Co, Cr, or Zn on the n-Si:
  Sacrificial Cu, Ag, Zn, Co, In, or Fe foils can be connected to the backside of the cell as counter electrode (CE), or Reversible redox chemical ions can be used in the solution, such as $V^{2+}/V^{3+}$, or $Fe^{2+}/Fe^{3+}$.

Electrodeposit Ni, Pd, Pt on the n-Si:

Sacrificial Cu, Ag, Zn, Co, In, Fe, or Sn foils can be connected to the backside of the cell, or Reversible redox chemical ions can be used in the solution, such as $O_2/H_2O_2$, $Fe^{3+}/Fe^{2+}$, $I_2/I^-$, $H^+/H_2$, or $V^{2+}/V^{3+}$.

Other platable metals may be designed in the similar manner as above.

As described above, the method uses two separate tank setup to separate the metal deposition and the coupling oxidation reaction in two tanks/solutions. This method is particularly beneficial to plate metals that are insoluble in its own plating solution, such as Ni, Pd, and Pt. The method also simplifies process control and opens choices of different plating baths for plating of Cu and Ag.

Obviously, numerous modifications and variations of the disclosure are possible in light of the above disclosure. It is therefore understood that within the scope of the appended claims, the disclosure may be practiced otherwise than as specifically described herein.

What is claimed is:

1. A method of forming patterned metallization by electrodeposition under illumination on a photovoltaic structure, comprising:
   providing a primary and a secondary tank, wherein the primary tank is for a metal deposition reaction and the second tank is for a coupling oxidation reaction;
   introducing a metal plating solution into the primary and secondary tank, wherein the secondary tank solution comprises chemical ions with reversible redox reactions;
   immersing a photovoltaic structure into the metal plating solution of the primary tank;
   electrically connecting the backside of the photovoltaic structure to the metal plating solution in the secondary tank with external electrical connection wires;
   illuminating the frontside of the photovoltaic structure; and
   electrodepositing a metal pattern on the photovoltaic structure to form the patterned metallization.

2. The method according to claim 1, wherein the metal plating solution in the primary and secondary tanks comprises copper (Cu), cobalt (Co), and/or nickel (Ni).

3. The method according to claim 2, wherein the metal plating solution in the secondary tank comprises a lower chemical concentration than the metal plating solution in the primary tank, without any additives.

4. The method according to claim 1, wherein the pattern is a (Cu) copper (Cu), cobalt (Co), and/or nickel (Ni) grid pattern.

5. The method according to claim 1, wherein Cu is used as a counter electrode (CE), and the backside of the photovoltaic structure is electrically connected to the metal plating solution in the secondary tank with electrical connection wires comprising Cu (copper).

6. The method according to claim 1, wherein metal is selectively deposited on a n-Si region of a transistor or junction of the photovoltaic structure.

7. The method according to claim 1, wherein the metal is selected from the group consisting of Cu, Ag, Co, Cr, Zn, Ni, Pd, and Pt.

8. The method according to claim 1, wherein the structure is a solar cell.

9. The method according to claim 8, wherein the a solar cell comprises a n-Si emitter layer on top of a p-Si base.

10. The method according to claim 9, wherein an passivation layer and antireflection layer with grid pattern are deposited on the frontside (n-emitter) surface.

11. The method according to claim 9, wherein spin on insulating and transparent dielectric are used to build a higher aspect ratio grid structure.

12. A method of forming patterned metallization by electrodeposition under illumination on a photovoltaic structure, comprising:
   providing a primary and a secondary tank, wherein the primary tank is for a metal deposition reaction and the second tank is for a coupling oxidation reaction;
   introducing a metal plating solution into the primary and secondary tank, wherein the secondary tank solution comprises chemical ions with reversible redox reactions and wherein the metal plating solution introduced into the secondary tank comprises a lower chemical concentration than the metal plating solution introduced into the primary tank;
   immersing a photovoltaic structure into the metal plating solution of the primary tank, wherein the photovoltaic structure comprises a n-Si emitter layer on top of a p-Si base that is coated with a conductive layer;
   electrically connecting the backside of the photovoltaic structure to the metal plating solution in the secondary tank with external electrical connection wires;
   illuminating the frontside of the photovoltaic structure; and
   electrodepositing metal grid pattern on the photovoltaic structure to form the patterned metallization, without use of an external voltage supply.

13. The method of claim 12, wherein the conductive layer on the p-Si base is about 5 to about 50 microns thick and comprises (Al) aluminum and/or (Ag) silver.

14. The method of claim 13, wherein the n-Si emitter layer is textured to minimize reflection.

15. The method of claim 13, wherein the n-Si emitter layer is treated with a passivation layer and an antireflection layer to improve device performance.

16. The method of claim 15, wherein the passivation layer is thermal $SiO_2$ and an antireflection layer comprises nitride, nitride/oxide, TiO2, and/or $MgF_2$.

17. The method of claim 12, further comprising measuring the current/charge passed between the primary tank and the secondary tank during deposition with an amp meter configured to measure the current/charge passed between the primary tank and the secondary tank during deposition.

18. The method of claim 12, wherein the photovoltaic structure further comprises a spin on insulating and transparent dielectric to build a higher aspect ratio.

19. A method of forming patterned metallization by electrodeposition under illumination on a photovoltaic structure, comprising:
   providing a primary and a secondary tank, wherein the primary tank is for a metal deposition reaction and the second tank is for a coupling oxidation reaction;
   introducing a (Cu) metal plating solution into the primary and secondary tank, wherein the secondary tank solution comprises chemical ions with reversible redox reactions and wherein the (Cu) metal plating solution introduced into the secondary tank comprises a lower chemical concentration than the (Cu) metal plating solution introduced into the primary tank;
   immersing a photovoltaic structure into the (Cu) copper metal plating solution of the primary tank, wherein the photovoltaic structure comprises a n-Si emitter layer on top of a p-Si base, wherein the n-Si emitter layer is textured to minimize reflection and has been treated with a passivation layer and an antireflection layer, and the p-Si base is coated with a conductive layer having a thickens of about 5 to about 50 microns and comprises (Al) aluminum and/or (Ag) silver;

electrically connecting the backside of the photovoltaic structure to the metal plating solution in the secondary tank with external electrical connection wires;

illuminating the frontside of the photovoltaic structure; and electrodepositing (Cu) copper metal grid pattern on the photovoltaic structure to form the patterned metallization, without use of an external voltage supply.

\* \* \* \* \*